United States Patent
Fukazawa (10) Patent No.: US 9,583,642 B2
(45) Date of Patent: Feb. 28, 2017

(54) DIODE

(71) Applicant: DENSO CORPORATION, Kariya, Aichi-pref. (JP)

(72) Inventor: Takeshi Fukazawa, Kariya (JP)

(73) Assignee: DENSO CORPORATION, Kariya (JP)

(*) Notice: Subject to any disclaimer, the term of this patent is extended or adjusted under 35 U.S.C. 154(b) by 0 days.

(21) Appl. No.: 14/936,872

(22) Filed: Nov. 10, 2015

(65) Prior Publication Data

US 2016/0133757 A1 May 12, 2016

(30) Foreign Application Priority Data

Nov. 10, 2014 (JP) .................................. 2014-228282

(51) Int. Cl.
| | |
|---|---|
| *H01L 29/66* | (2006.01) |
| *H01L 29/87* | (2006.01) |
| *H01L 29/06* | (2006.01) |
| H01L 29/16 | (2006.01) |

(52) U.S. Cl.
CPC .......... *H01L 29/87* (2013.01); *H01L 29/0619* (2013.01); *H01L 29/66121* (2013.01); *H01L 29/1608* (2013.01)

(58) Field of Classification Search
USPC .......................................... 257/109; 438/140
See application file for complete search history.

(56) References Cited

U.S. PATENT DOCUMENTS

| | | | | | |
|---|---|---|---|---|---|
| 4,016,593 | A | * | 4/1977 | Konishi .............. | H01L 31/1113 250/227.32 |
| 4,338,617 | A | * | 7/1982 | Akamatsu ............. | H01L 29/744 257/149 |
| 6,855,970 | B2 | * | 2/2005 | Hatakeyama ....... | H01L 29/0615 257/164 |
| 7,026,668 | B2 | * | 4/2006 | Hatakeyama ....... | H01L 29/0615 257/264 |
| 7,439,563 | B2 | * | 10/2008 | Hatakeyama ....... | H01L 29/0615 257/121 |
| 2003/0178672 | A1 | * | 9/2003 | Hatakeyama ....... | H01L 29/0615 257/328 |

(Continued)

FOREIGN PATENT DOCUMENTS

| | | |
|---|---|---|
| JP | S58-048955 | 3/1983 |
| JP | S62-112380 | 5/1987 |

*Primary Examiner* — Telly Green
(74) *Attorney, Agent, or Firm* — Nixon & Vanderhye P.C.

(57) ABSTRACT

A diode has a multiple p-n junction body, anode and cathode electrodes, a short-circuit electrode, a guard ring, and an insulation film. The multiple p-n junction body has first to fourth semiconductor layers stacked to provide a lamination structure between the anode electrode and the cathode electrode. Each of the first and third semiconductor layers is a first conductive semiconductor. Each of the second and fourth semiconductor layers is a second conductive semiconductor. The first and second semiconductor layers form a p-n junction. The second and third semiconductor layers form a p-n junction. The third and fourth semiconductor layers form a p-n junction. The short circuit electrode provides a short circuit between the second semiconductor layer and the third semiconductor layer. A high concentration region is formed in a contact region in the second semiconductor layer. A surface of the contact region is in contact with the short-circuit electrode.

10 Claims, 8 Drawing Sheets

(56) References Cited

U.S. PATENT DOCUMENTS

| | | | | |
|---|---|---|---|---|
| 2005/0029557 A1* | 2/2005 | Hatakeyama | ....... | H01L 29/0615 257/263 |
| 2005/0029558 A1* | 2/2005 | Hatakeyama | ....... | H01L 29/0615 257/264 |
| 2006/0226504 A1* | 10/2006 | Hatakeyama | ....... | H01L 29/0615 257/472 |

* cited by examiner

FIG.1

FIG.2A    IGT

EQUIVALENT CIRCUIT

FIG.6

FORMATION OF GUARD RING

FIG.7

FORMATION OF THIRD SEMICONDUCTOR LAYER

FIG.8

FORMATION OF OPENING SECTION IN INSULATION LAYER

FIG.9

FORMATION OF FOURTH SEMICONDUCTOR LAYER

FIG.10

MESA-ETCHING OF FOURTH SEMICONDUCTOR LAYER

FIG.11

FORMATION OF HIGH CONCENTRATION REGION

(RELATED ART)

DIODE

CROSS-REFERENCE TO RELATED APPLICATION

This application is related to and claims priority from Japanese Patent Application No. 2014-228282 filed on Nov. 10, 2014, the contents of which are hereby incorporated by reference.

BACKGROUND OF THE INVENTION

1. Field of the Invention

The present invention relates to diodes, in particular, relates to p-n junction diodes that are resistant to high voltage and high surge voltages.

2. Description of the Related Art

An internal combustion engine uses an ignition device. Such an ignition device consists of a primary coil and a secondary coil. A high voltage within a range of 10 kV to 30 kV (discharging voltage) is generated in the secondary coil when the supply of a predetermined voltage to the primary coil is interrupted. When the generated high voltage is supplied between electrodes of a spark plug in the ignition device, an electric discharge is generated to burn fuel in the internal combustion engine. Because the high voltage is generated in the secondary coil when the voltage supply to the primary coil of the ignition device is interrupted, a small voltage (ON-voltage) is also generated during the voltage supply to the primary coil. For this reason, there is a possible problem in which such an ON-voltage generated in the primary coil causes ignition combustion (ON-flying spark) at a timing earlier than, i.e. before a desired timing.

In patent document 1, Japanese patent laid open publication No. S58-48955, an additional diode is connected to the secondary coil in order to prevent the On-flying sparks. This additional diode is connected in a direction in which a discharging voltage allows a current to flow.

Figure 2A:
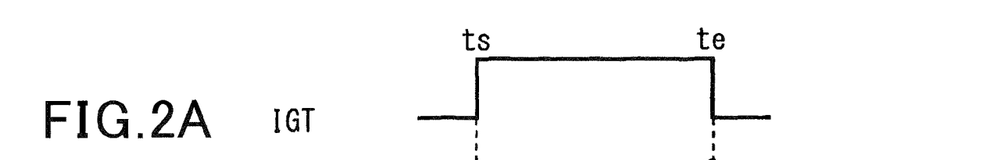
FIG. 2A, FIG. 2B and FIG. 2C are views explaining behavior of the diode according to the first exemplary embodiment shown in FIG. 1 capable of preventing generation of an on-flying spark.
Figure 2B:
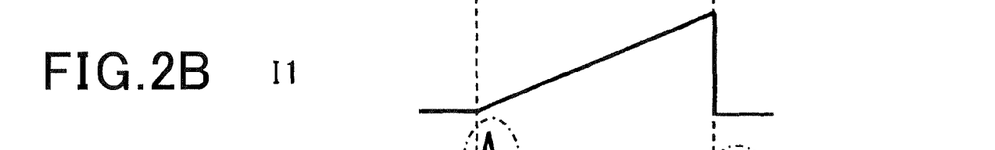
Figure 2C:
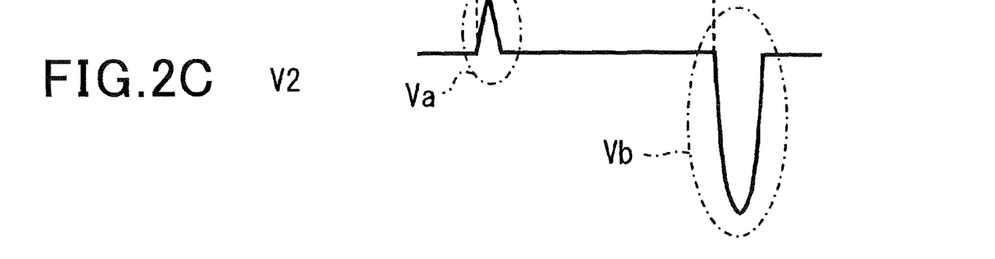

As shown in FIG. 2C, because an ON-voltage Va is generated in reverse polarity to a discharging voltage Vb, the additional diode can prevent the current generated by the ON-voltage, and this can prevent phenomenon of an ON-flying spark.

Because the ON-voltage has a high voltage within a range of 1 kV to 1.5 kV, it is necessary for the additional diode to have a high breakdown voltage (high withstand voltage) of not less than 2 kV. The diode 5x shown in FIG. 17A to FIG. 17F disclosed in the patent document 1 has a plurality of diode elements 90 connected in series. This structure of the diode 5x makes it possible to provide a high breakdown voltage (high withstand voltage) which is higher than a breakdown voltage of the single diode element 90.

A description will be given of a process of producing the diode 5x with reference to FIG. 17A to FIG. 17F.

FIG. 17A to FIG. 17F are schematic views showing a process of producing a conventional diode.

Figure 17A:
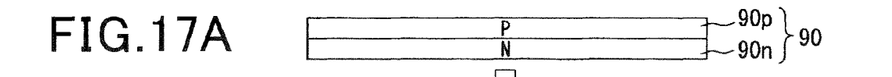
FIG. 17A to FIG. 17F are schematic views showing a process of producing a diode having a conventional structure.

As shown in FIG. 17A, a deep p type semiconductor layer 90p is formed in an n-type semiconductor substrate 90n, and a diffusion wafer is prepared so that a plurality of the p-n junctions is formed on the entire surface of the diffusion wafer. The diode element 90 corresponds to the p-n junction formed on the surface of the diffusion wafer.

Figure 17B:
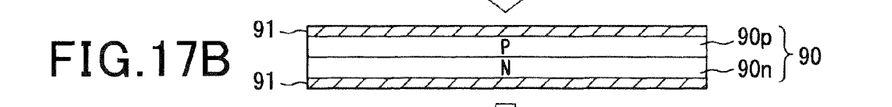
Figure 17C:
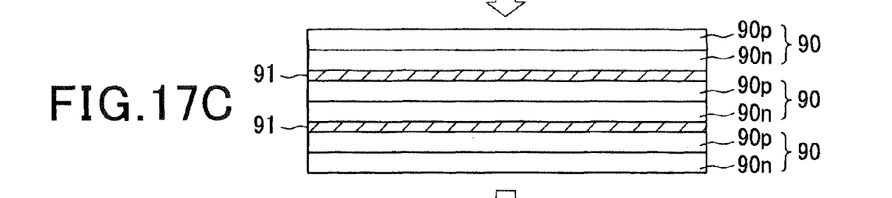
Figure 17D:
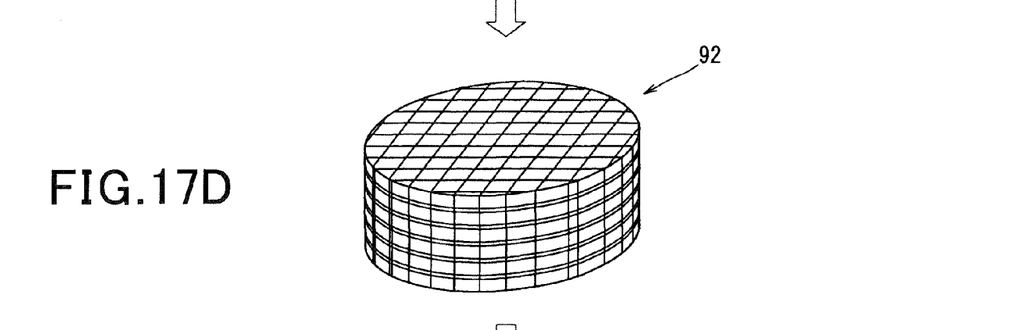

Next, as shown in FIG. 17B and FIG. 17C, the diffusion wafers are stacked to provide a lamination structure under vacuum by using solder in order to produce a lamination body 92 in which the diffusion wafers and the solder layers are alternately stacked.

Figure 17E:
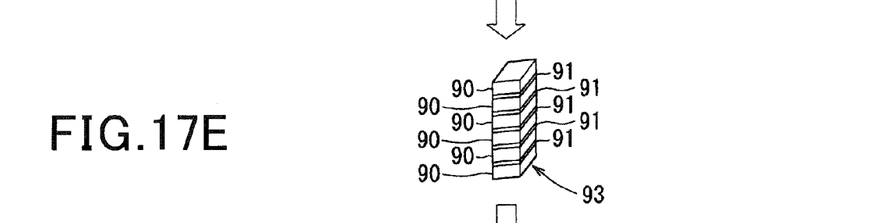
Figure 17F:
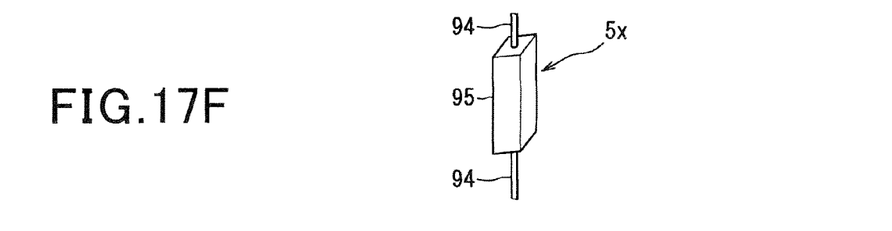

Next, the produced lamination body 92 is cut by using a wire saw to produce a lamination part 93 shown in FIG. 17E.

Next, a cut surface of the lamination part 93 is etched by acid or alkali solution (end surface treatment). Next, lead wires 94 are connected to the lamination part 93, and molded by using resin material 95 to produce the diode 5x.

However, the diode 5x has a large size because of having a plurality of the solder layers between the diffusion wafers.

In a usual planar diode, it is possible to increase a thickness of the p-type or n-type semiconductor layer in order to reduce its impurity concentration. It is accordingly possible to produce a single diode element having a high breakdown voltage without forming a lamination structure of the diode elements 90. However, when the impurity concentration of the diode is reduced, the breakdown voltage of the diode increases, and the surge voltage protection of the diode is reduced. This damages the diode element by a surge voltage generated when a spark plug discharges. Accordingly, because it is requested to enlarge the surface area of the semiconductor layer (to enlarge its chip size), it is difficult to prevent the entire size of the diode from increasing.

Various types of diodes, intended to have high breakdown voltage and high surge voltage protection, contain such a conventional problem previously described.

SUMMARY

It is therefore desired to provide a diode having a reduced size, a high breakdown voltage and high surge voltage protection capable of preventing damages being caused by a surge voltage with a reduced size.

An exemplary embodiment provides a diode having a first semiconductor layer of a first conductive type, a second semiconductor layer of a second conductive type, a third semiconductor layer of the first conductive type, a fourth semiconductor layer of the second conductive type, and a short circuit member. In particular, the first semiconductor layer and the second semiconductor layer form a p-n junction. The third semiconductor layer and the second semiconductor layer form a p-n junction. The fourth semiconductor layer and the third semiconductor layer form a p-n junction. The short circuit member provides a short circuit between the second semiconductor layer and the third semiconductor layer.

In the structure of the diode previously described, the first semiconductor layer, the second semiconductor layer, the third semiconductor layer and the fourth semiconductor layer provide a first diode element and a second diode element. The first diode element consists of the first semiconductor layer and the second semiconductor layer which form the p-n junction. The second diode element consists of the third semiconductor layer and the fourth semiconductor layer which form the p-n junction. The first diode element and the second diode element provide an equivalent circuit having a structure in which the first diode element and the second diode element are connected in series in a forward direction. The cathode side of the first diode is connected to the anode side of the second diode element in the forward direction.

If the diode has no short circuit member, the second semiconductor layer and the third semiconductor element form a third diode element. This third diode element is connected in reverse direction between the first diode element and the second diode element (see FIG. 5). This structure prevents correct behavior of the equivalent circuit.

On the other hand, in the structure of the diode according to the present invention, because the short circuit member provides a short circuit between the second semiconductor layer and the third semiconductor layer, the equivalent circuit does not have any third diode element. It is therefore possible for the diode according to the present invention to have a high breakdown voltage (high withstand voltage) because the first diode element and the second diode element are connected in series in the forward direction.

Further, the diode according to the present invention has the structure in which a short circuit of the p-n junction between the second semiconductor layer and the third semiconductor layer provides the connection between the first diode element and the second diode element. This structure allows the first diode element and the second diode element to be connected without using solder, and allows the diode to have a reduced size when compared with a size of the diode of a conventional structure having a structure in which many diode elements 90 are connected by using solder.

Still further, because the diode according to the present invention provides the equivalent circuit in which the diode elements are connected in series, it is possible for the diode to have a high breakdown voltage without increasing a thickness of each of the semiconductor layers in order to reduce impurity concentration. Because this structure prevents damages being cause by the surge voltage, it is possible to avoid increasing an overall surface area of the semiconductor layers (i.e. increasing the chip size of the diode) in order to increase damages being caused by surge voltage.

As previously described, the present invention provides the equivalent circuit of the diode having the structure in which the first diode element and the second diode element are connected in series in the forward direction by forming a short circuit between the second semiconductor layer and the third semiconductor layer. Because this structure does not require any solder layer in order to connect the semiconductor layers, it is possible to suppress an overall size of the diode form increasing and to have a high breakdown voltage and a high surge voltage protection capable of preventing damages being caused by surge voltage.

BRIEF DESCRIPTION OF THE DRAWINGS

A preferred, non-limiting embodiment of the present invention will be described by way of example with reference to the accompanying drawings, in which.

DETAILED DESCRIPTION OF THE PREFERRED EMBODIMENTS

Hereinafter, various embodiments of the present invention will be described with reference to the accompanying drawings. In the following description of the various embodiments, like reference characters or numerals designate like or equivalent component parts throughout the several diagrams.

First Exemplary Embodiment

A description will be given of a diode 5 according to a first exemplary embodiment with reference to FIG. 1 to FIG. 15.

Figure 1:
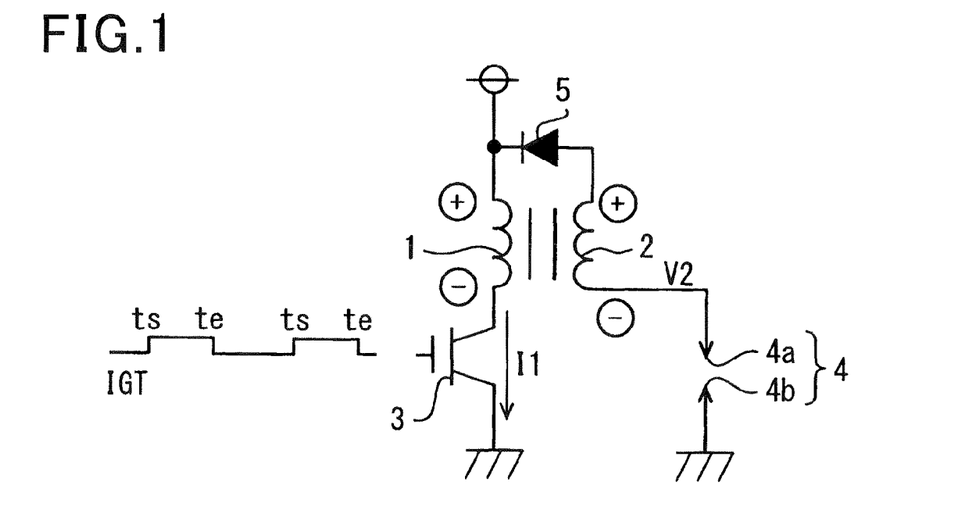
FIG. 1 is a view showing a schematic structure of an ignition device equipped with a diode according to a first exemplary embodiment of the present invention.

FIG. 1 is a view showing a schematic structure of an ignition device equipped with the diode 5 according to the first exemplary embodiment. As shown in FIG. 1, the ignition device has a primary coil 1, a secondary coil 2, a switching element 3, a spark plug 4 and the diode 5. The switching element 3 receives an ignition signal IGT transmitted from a control device (not shown), and turns on and off on the basis of the received ignition signal IGT.

A description will now be given of behavior of the ignition device with reference to FIG. 2A, FIG. 2B and FIG. 2C.

FIG. 2A, FIG. 2B and FIG. 2C are views explaining behavior of the diode 5 according to the first exemplary embodiment shown in FIG. 1 capable of preventing generation of an on-flying spark. FIG. 2A shows a change of the ignition signal IGT. FIG. 2B shows a primary current I1. FIG. 2C shows a change of a secondary voltage.

The ignition signal IGT is a pulse signal. When the ignition signal IGT becomes a high level at a turned-on timing ts, the switching element 3 turns on. A battery voltage is supplied to the primary coil 1, and the primary current I1 starts to flow. On the other hand, when the ignition signal IGT as a pulse signal becomes a low level at a turned-off timing te, the switching element 3 turns off. This interrupts the supply of the battery voltage to the primary coil 1. The primary current I1 stops flowing in the primary coil 1. At this time, a discharging voltage Vb is generated in the secondary coil 2. This discharging voltage Vb is a high voltage within a range of 10 kV to 30 kV. When this discharging voltage Vb is supplied between electrodes 4a and 4b of the spark plug 4, discharging occurs between the electrodes 4a and 4b. The discharging ignites a fuel gas in a combustion chamber of an internal combustion engine, and a combustion of the fuel gas occurs in the combustion chamber.

As previously described, a voltage is generated in the secondary coil 2 when the voltage supply to the primary coil 1 is interrupted. In addition to this phenomenon, a small voltage (ON-voltage Va) is also generated in the secondary coil 2 when the voltage supply starts to the primary coil 1. Accordingly, there is a possible problem of generating an unnecessary discharging in the spark plug 4 by the ON-voltage Va, and causing an ignition combustion (ON-flying spark, i.e. premature sparking) in the combustion chamber at an early timing which is before a desired timing.

In order to avoid this problem, the diode 5 according to the first exemplary embodiment has an improved structure capable of preventing the discharging current from flowing by the ON voltage Va while allowing a discharging current to flow when the discharging voltage Vb is supplied to the spark plug 4.

Specifically, an anode of the diode 5 is connected to a high voltage side of the secondary coil 2. A cathode of the diode 5 is connected to a high voltage side of the primary coil 1. Because the ON voltage Va is generated reverse in polarity to the discharging voltage Vb, a discharging current generated by the discharging voltage Vb flows in reverse to a forward direction of the diode 5. On the other hand, because the ON voltage Va is applied in reverse direction to the diode 5, the ON voltage Va suppresses the discharging current from flowing. That is, the diode 5 prevents premature sparking, i.e. generation of ON-flying spark.

Figure 3:
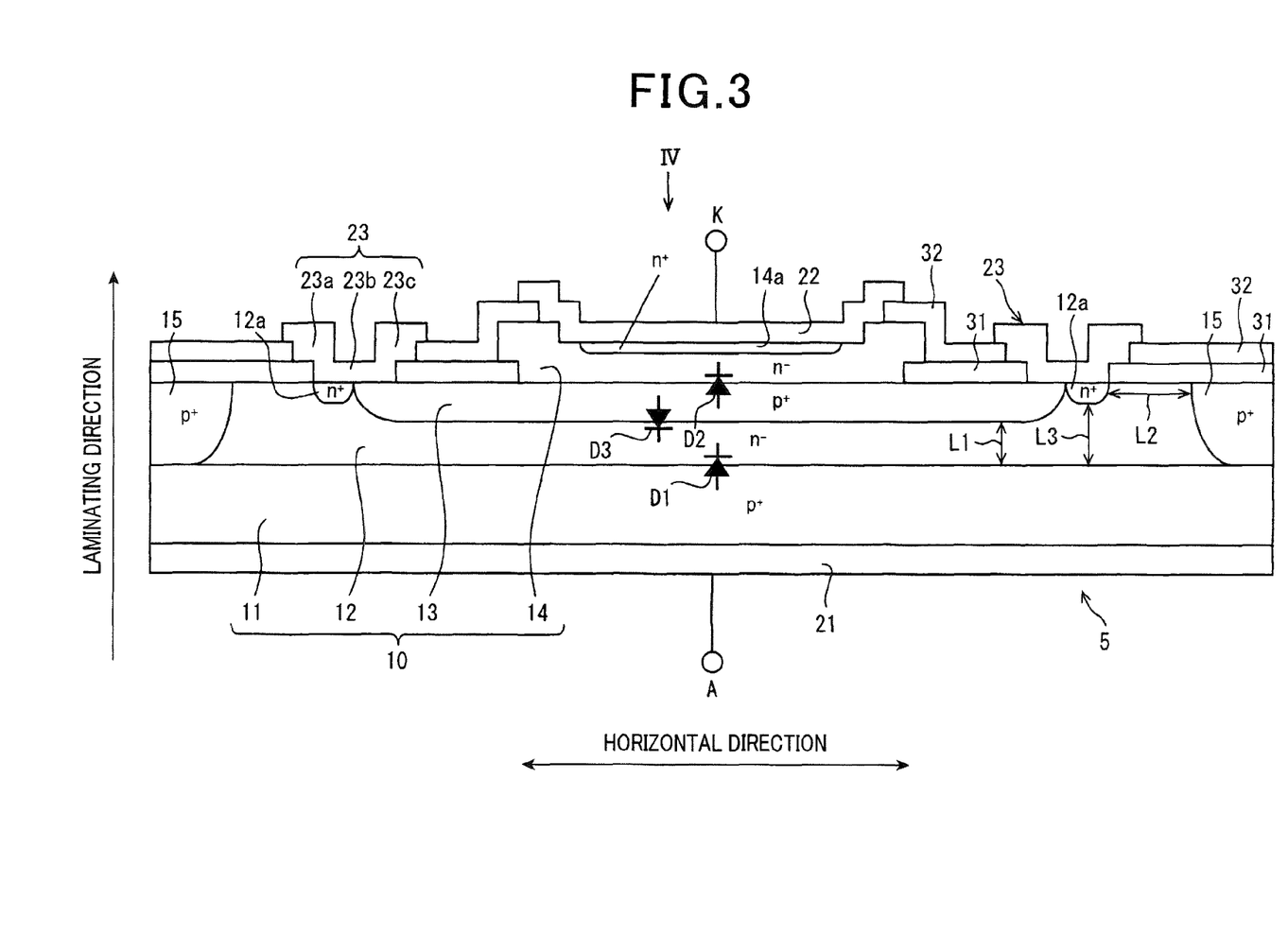
FIG. 3 is a view showing a schematic cross section of the diode according to the first exemplary embodiment shown in FIG. 1.

FIG. 3 is a view showing a schematic cross section of the diode 5 according to the first exemplary embodiment shown in FIG. 1.

FIG. 3 is a view showing a schematic cross section of the diode 5 according to the first exemplary embodiment shown in FIG. 1.

As shown in FIG. 3, the diode 5 has a multiple p-n junction body 10, an anode electrode 21, a cathode electrode 22, a short-circuit electrode 23 (or a short-circuit member 23), a guard ring 15, and an insulation film 30, etc. The multiple p-n junction body 10 has a structure in which a first semiconductor layer 11 of a p-type (hereinafter, the first semiconductor layer 11), a second semiconductor layer 12 of an n-type (hereinafter, the second semiconductor layer 12), a third semiconductor layer 13 of a p-type (hereinafter, a third semiconductor layer 13) and a fourth semiconductor layer 14 of an n-type (hereinafter, a fourth semiconductor layer 14) are sequentially stacked to provide a lamination structure viewed from the anode electrode 21 side. The two adjacent semiconductor layers in the first semiconductor layer 11, the second semiconductor layer 12, the third semiconductor layer 13, and the fourth semiconductor layer 14 form a p-n junction.

The anode electrode 21 is a film of a square shape in a planer view (see FIG. 4) and in contact with an overall surface of the first semiconductor layer 11, which is opposite to the second semiconductor layer 12. The anode electrode 21 has a three layer structure in which different metal films are stacked to provide a lamination structure. For example, a first metal file of the anode electrode 21, which is in contact with the first semiconductor layer 11, is made of titanium. A second metal film of the anode electrode 21, which is arranged opposite to the first semiconductor layer 11, is made of gold. An intermediate metal film of the anode electrode 21 between the first metal film and the second metal film is made of nickel.

The first semiconductor layer 11 has a square shape in a planner view and a constant thickness, for example, within a range of 100 μm to 200 μm. The first semiconductor layer 11 is a p-type semiconductor substrate in which p-type impurity such as boron, etc. has been added into silicon. A concentration of the p-type impurity in the first semiconductor layer 11 has been adjusted to have a predetermine concentration.

Figure 4:
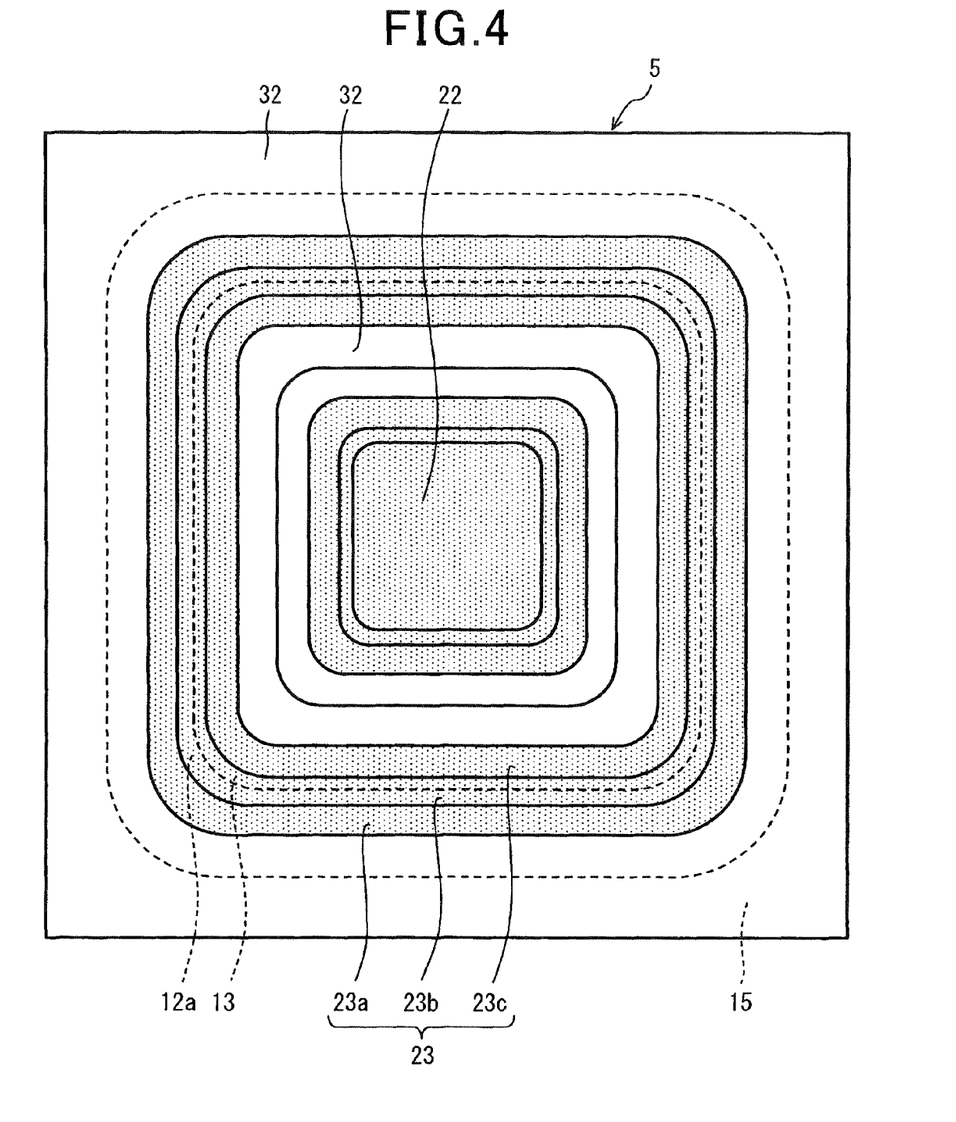
FIG. 4 is a plan view showing the diode when viewed in a direction designated by an arrow IV shown in FIG. 3.

As shown in FIG. 3 and FIG. 4, the guard ring 15 is a p-type semiconductor formed in the second semiconductor layer 12 formed on the first semiconductor layer 11. The guard ring 15 has a frame-shaped structure (see FIG. 4) formed in the second semiconductor layer 12 which is formed on the first semiconductor layer 11, and formed on the surface of the first semiconductor layer 11 at the cathode electrode 22 side so that the guard ring 15 is formed adjacently to an outer peripheral part of the first semiconductor layer 11. The guard ring 15 is formed so that a thickness (or a diffusion depth) of the guard ring 15 becomes not less than a thickness of the second semiconductor layer 12. It is also possible for the guard ring 15 to have various shapes such as annular, square, rectangular, etc. when viewed in the plan view shown in FIG. 4. After the formation of the guard ring 15 in the second semiconductor layer 12 on the first semiconductor layer 11, the second semiconductor layer 12 is arranged inside of the guard ring 15 having a frame-shaped structure and on the surface at the cathode electrode 22 side of the first semiconductor layer 11.

The second semiconductor layer 12 is an n-type semiconductor formed by epitaxial growth of phosphorus as impurity on the first semiconductor layer 11. The n-type impurity in the second semiconductor layer 12 has a predetermined low concentration. The second semiconductor layer 12 has a high concentration region 12a containing the n-type impurity of a predetermined high concentration. The structure and function of the high concentration region 12a will be explained later. The second semiconductor layer 12 and the first semiconductor layer 11 form a first diode element D1 (see FIG. 5) as a p-n junction.

The third semiconductor layer 13 is formed adjacent to the surface of second semiconductor layer 12 at the cathode electrode 22 side. A part of the second semiconductor layer 12, which is adjacent to the third semiconductor layer 13, is smaller in thickness than the other region of the second semiconductor layer 12. In other words, the guard ring 15, which is the part of the second semiconductor layer 12, and the third semiconductor layer 13 are arranged in a direction (the horizontal direction in FIG. 3) which is perpendicular to the laminating direction (i.e. the vertical direction shown in FIG. 3) of the four semiconductor layers 11, 12, 13 and 14.

The second semiconductor layer 12 at the cathode electrode 22 side, the third semiconductor layer 13 at the cathode electrode 22 side and the guard ring 15 at the cathode electrode 22 side are formed to have the same flat surface. That is, the third semiconductor layer 13 is smaller in thickness than the second semiconductor layer 12. The third semiconductor layer 13 is a p-type semiconductor having a structure in which p-type impurity such as boron has been added in silicon. The p-type impurity in the third semiconductor layer 13 has a predetermined high concentration. The third semiconductor layer 13 and the second semiconductor layer 12 form a p-n junction.

The high concentration part 12a of the second semiconductor layer 12 is formed adjacent in the horizontal direction to the third semiconductor layer 13. The high concentration part 12a of the second semiconductor layer 12 has a thickness which is smaller than the thickness of the third semiconductor layer 13. The high concentration part 12a of the second semiconductor layer 12 has a frame-shaped structure formed along the outer periphery of the third semiconductor layer 13. It is also possible for the high concentration part 12a to have various shapes such as annular, square, rectangular, etc. when viewed in the plan view shown in FIG. 4.

The short-circuit electrode 23 is formed adjacent to the surface at the cathode electrode 22 side of the third semiconductor layer 13 and the surface at the cathode electrode 22 side of the high concentration part 12a. The third semiconductor layer 13 is electrically connected to the high concentration part 12a of the second semiconductor layer 12 through the short-circuit electrode 23.

FIG. 4 is a plan view showing the diode 5 when viewed in a direction designated by an arrow IV shown in FIG. 3. In FIG. 4, the short-circuit electrode 23 is shown by the mesh part. As shown in FIG. 4, the short-circuit electrode 23 has a frame-shaped structure formed extending in the horizontal direction.

A distance between the first semiconductor layer 11 and the third semiconductor layer 13 in the laminating direction is a first separation distance L1. A distance between the guard ring 15 and the high concentration part 12a of the second semiconductor layer 12 in the horizontal direction is a second separation distance L2. A distance between the first semiconductor layer 11 and the high concentration part 12a of the second semiconductor layer 12 in the laminating direction is a third separation distance L1. In the structure of the diode 5 according to the first exemplary embodiment, the second separation distance L2 is larger than the first separation distance L1, and the third separation distance L3 is larger than the first separation distance L1.

The surface at the cathode electrode 22 side of the third semiconductor layer 13, the surface at the cathode electrode 22 side of the second semiconductor layer 12, and the surface at the cathode electrode 22 side of the guard ring 15 are covered with a first insulation film 31. The first insulation film 31 is covered with an electrically insulating material such as silicon dioxide, etc.

The surface of the first semiconductor layer 11, at the side opposite to the second semiconductor layer 12, is covered with a second insulation film 32. In particular, the short-circuit electrode 23 is exposed from the second insulation film 32.

The short-circuit electrode 23 is made of metal having conductive properties such as aluminum. The short-circuit electrode 23 is composed of an outer flange part 23a, a short circuit part 23b and an inner flange part 23c. The third semiconductor layer 13 is electrically connected to the high concentration part 12a of the second semiconductor layer 12 through the short circuit part 23b.

A section of the short circuit part 23b which is in contacted with the third semiconductor layer 13 has the same area of a section of the short circuit part 23b which is in contact with the high concentration part 12a of the second semiconductor layer 12. A horizontal length of the short circuit part 23b, which is in contact with the third semiconductor layer 13, is the same of the horizontal length of the short circuit part 23b which is in contact with the high concentration part 12a of the second semiconductor layer 12. The horizontal length of the short circuit part 23b is within a range of 1 μm to 10 μm.

The outer flange part 23a is formed to project toward the outside of the short circuit part 23b having a frame-shaped structure. The inner flange part 23c is formed to project toward the inside of the short circuit part 23b having a frame-shaped structure (see FIG. 4). The outer flange part 23a and the inner flange part 23c are arranged inside of the cathode electrode 22 side viewed from the first insulation film 31. It is also possible for each of the outer flange part 23a, the short circuit part 23b and the inner flange part 23c to have various shapes such as annular, square, rectangular, etc. when viewed in the plan view shown in FIG. 4.

The fourth semiconductor layer 14 is arranged adjacent to the third semiconductor layer 13 at the cathode electrode 22 side. The outer periphery of the fourth semiconductor layer 14 is separated in the horizontal direction from the inner periphery of the inner flange part 23c by a predetermined distance. When viewed along the horizontal direction in FIG. 3, the first insulation film 31 and the second insulation film 32 are formed between the fourth semiconductor layer 14 and the short-circuit electrode 23. The fourth semiconductor layer 14 is smaller in thickness than the first semiconductor layer 11. The fourth semiconductor layer 14 is an n-type semiconductor in which an impurity such as phosphorus has been added to the silicon, i.e. doped into the silicon.

The n-type impurity in the fourth semiconductor layer 14 has a predetermined low concentration. The fourth semiconductor layer 14 has a high concentration region 14a containing the n-type impurity of a predetermined high concentration. The structure and behavior of the high concentration region 14a will be explained later. The fourth semiconductor layer 14 and the third semiconductor layer 13 form a second diode element D2 (see FIG. 5) as a p-n junction.

Figure 5:
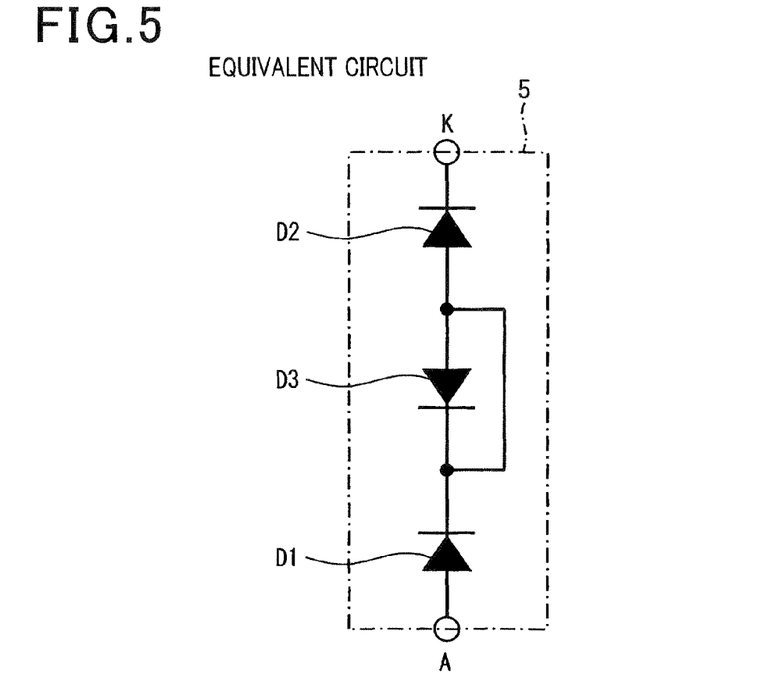
FIG. 5 is a view showing an equivalent circuit of the diode shown in FIG. 1.

FIG. 5 is a view showing an equivalent circuit of the diode shown in FIG. 1. As shown in FIG. 5, the anode of the first diode element D1 is connected to the anode electrode 21, and the cathode of the second diode element D2 is connected to the cathode electrode 22. The cathode of the first diode element D1 is connected to the anode of the second diode element D2 through the short-circuit electrode 23.

Because a short circuit is formed between the second semiconductor layer 12 and the third semiconductor layer 13 by the short-circuit electrode 23, an equivalent circuit of the diode 5 has no third diode D3 to be formed by the third semiconductor layer 13 and the second semiconductor layer 12. That is, as shown in FIG. 5 and FIG. 3, the equivalent circuit of the diode D5 according to the first exemplary embodiment has the structure in which the first diode element D1 and the second diode element D2 are connected in series in a forward direction without forming the third diode D3.

The high concentration region 14a of the fourth semiconductor layer 14 is formed in the fourth semiconductor layer 14 at the cathode electrode 22 side. As shown in FIG. 3, the cathode electrode 22 is electrically connected adjacently to the surface of the high concentration region 14a, which is opposite to the third semiconductor layer 13 side.

The cathode electrode 22 is designated by the mesh area shown in FIG. 4. The cathode electrode 22 is formed at the central area in the fourth semiconductor layer 14. The cathode electrode 12 is a film which is in contact with the overall area of the high concentration region 14a. That is, the cathode electrode 12 has a square shape in a planer view (see FIG. 4). The cathode electrode 12 has a film of a single layer made of metal such as aluminum.

A description will now be given of the method of producing the diode 5 according to the first exemplary embodiment with reference to FIG. 6 to FIG. 15.

Figure 6:
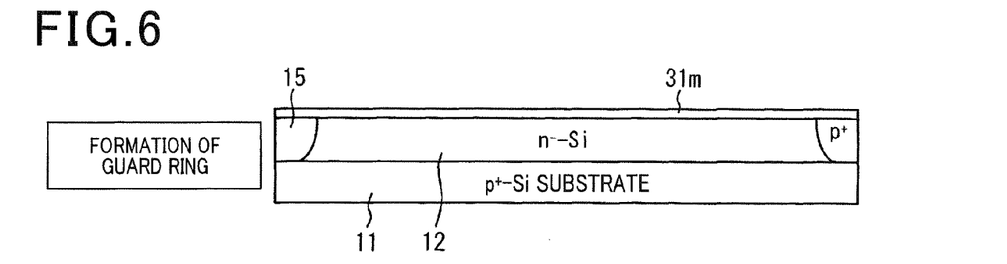
FIG. 6 is a view showing a cross section in a process of forming a guard ring in a manufacturing process of producing the diode according to the first exemplary embodiment of the present invention.

FIG. 6 is a view showing a cross section in a process of forming the guard ring 15 in the manufacturing process of producing the diode 5 according to the first exemplary embodiment.

At first, a p-type semiconductor substrate is prepared in order to produce the first semiconductor layer 11.

Next, an n-type semiconductor layer is formed on the overall surface at the cathode electrode side, i.e. at the upper side of the first semiconductor layer 11 by an epitaxial growth. This n-type semiconductor layer provides the second semiconductor layer 12.

Next, a drive-in diffusion process is performed in order to diffuse boron, by a predetermined depth, into the outer peripheral region of the n-type semiconductor layer by using ion implantation. This process makes it possible to form an n-type semiconductor layer at the outer peripheral region of the n-type semiconductor layer. That is, this process forms the guard ring 15.

Next, the upper overall surface of the second semiconductor layer 12 and the upper overall surface of the guard ring 15 are oxidized to form a silicon dioxide film 31m. This silicon dioxide film 31m provides the first insulation film 31.

Figure 7:
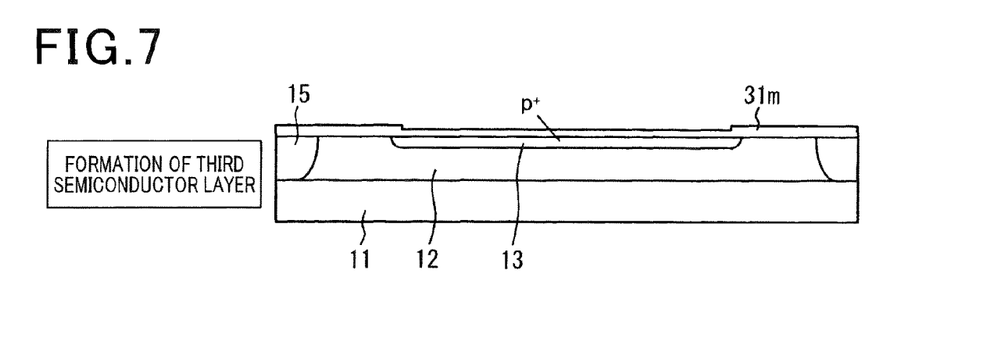
FIG. 7 is a view showing a cross section in a process of forming a third semiconductor layer in the manufacturing process of producing the diode according to the first exemplary embodiment of the present invention.

FIG. 7 is a view showing a cross section in a process of forming a third semiconductor layer in the manufacturing process of producing the diode 5 shown according to the first exemplary embodiment.

A patterning process is performed to form a photo resist having a predetermined shaped pattern in the photoresist formed on the upper surface of the silicon dioxide film 31m is patterned. After this, boron is diffused into the area by using ion implantation, from which the photo resist has been removed and in which the third semiconductor layer 13 will be formed. This area, into which boron has been diffused, becomes a p-type semiconductor and provides the third semiconductor layer 13.

Figure 8:
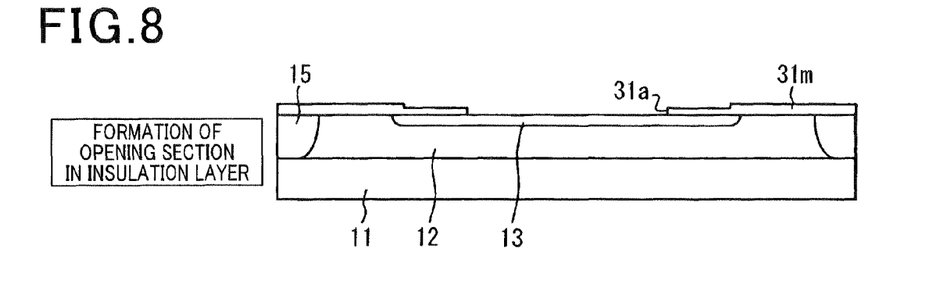
FIG. 8 is a cross section in a process of forming an opening section in an insulation layer in the manufacturing process of producing the diode according to the first exemplary embodiment of the present invention.

FIG. 8 is a cross section in a process of forming the opening section in an insulation layer of the diode 5 in the manufacturing process of producing the diode according to the first exemplary embodiment. As shown in FIG. 8, a specific area is removed from the silicon dioxide film 31m in order to form an opening section 31a in the silicon dioxide film 31m. The fourth semiconductor layer 14 will be formed in the opening section 31a. The silicon dioxide film 31m, from which the specific area has been removed, i.e., after the completion of forming the opening section 31a, becomes the first insulation film 31.

Figure 9:
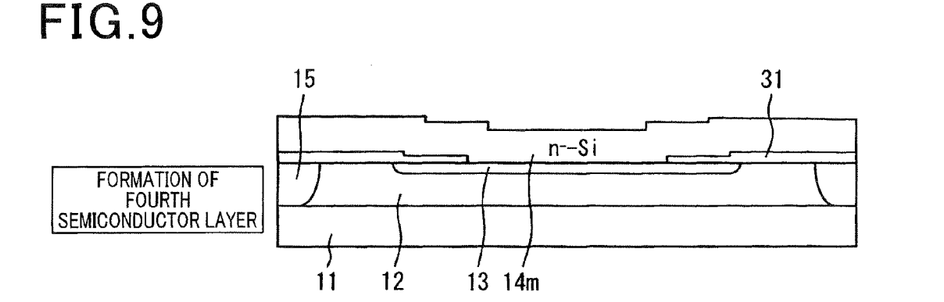
FIG. 9 is a view showing a cross section in a process of forming a fourth semiconductor layer in the manufacturing process of producing the diode according to the first exemplary embodiment of the present invention.

FIG. 9 is a view showing a cross section of a fourth semiconductor layer in the manufacturing process of producing the diode 5 according to the first exemplary embodiment.

As shown in FIG. 9, an n-type semiconductor layer 14m is formed on the upper surface of the first insulation film 31 and the upper surface of the third semiconductor layer 13 is exposed through the opening section 31a by epitaxial growth.

Figure 10:
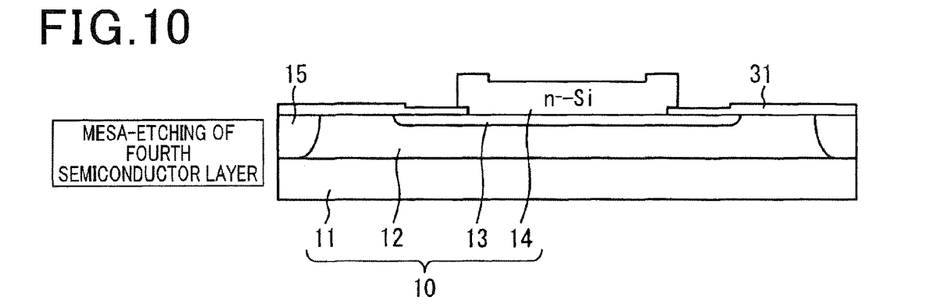
FIG. 10 is a view showing a cross section when a desired area is removed from an n-type semiconductor layer by a mesa-etching process in the manufacturing process of producing the diode 5 according to the first exemplary embodiment of the present invention.

FIG. 10 is a view showing a cross section when a desired area is removed from the n-type semiconductor layer 14m by a mesa-etching process in the manufacturing process of producing the diode 5 according to the first exemplary embodiment. The remaining area in the n-type semiconductor layer 14m provides the fourth semiconductor layer 14.

Next, a silicon dioxide film is formed on the upper overall surface of the diode 5 by thermal oxidization. The areas, in which the cathode electrode 22 and the short-circuit electrode 23 will be formed, are removed from the silicon dioxide film.

Figure 11:
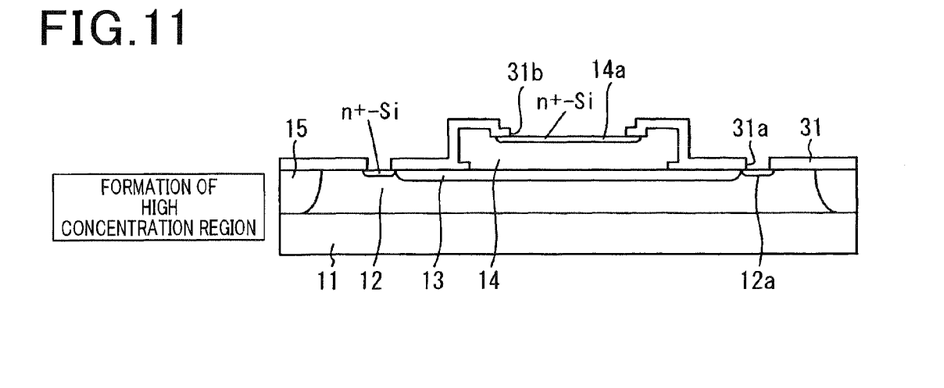
FIG. 11 is a view showing a cross section in a process of forming a high concentration region in the manufacturing process of producing the diode according to the first exemplary embodiment of the present invention.

FIG. 11 is a view showing a cross section in a process of forming the high concentration region in the manufacturing process of producing the diode 5 according to the first exemplary embodiment.

Next, as shown in FIG. 11, phosphorus is diffused, by ion implantation, in the area in the second semiconductor layer 12 and the area in the fourth semiconductor layer 14, from which the silicon dioxide have been removed, in order to form the high concentration regions 12a and 14a.

Figure 12:
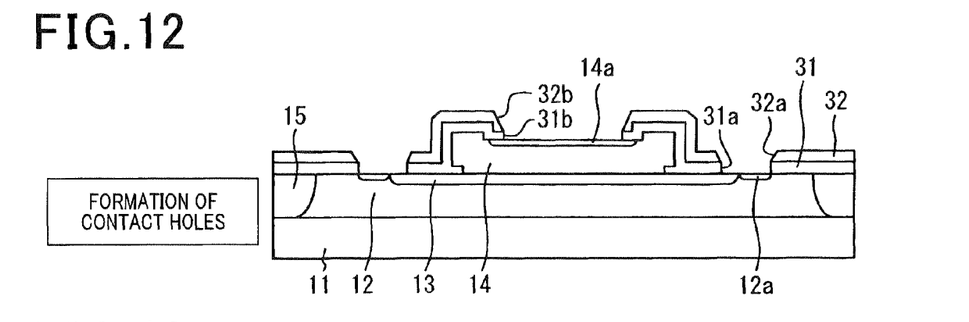
FIG. 12 is a view showing a cross section in a process of forming contact holes in the manufacturing process of producing the diode according to the first exemplary embodiment of the present invention.

FIG. 12 is a view showing a cross section in a process of forming contact holes in the manufacturing process of producing the diode 5 according to the first exemplary embodiment.

Next, as shown in FIG. 12, the second insulation film 32 is formed on the upper overall surface of the diode 5. The second insulation film 32 is a silicon dioxide film (Borophosphosilicate glass, i.e. BPSG) containing boron and phosphorus. Because the areas in which the cathode electrode 22 and the short-circuit electrode 23 will be formed have been removed from the BPSG, these removed areas surrounded by the BPSG form the opening sections 32a and 32b.

The BPSG, in which the opening sections 32a and 32b are formed, becomes the second insulation film 32. The opening sections 31a, 31bm 32a and 32b formed in the first insulation film 31 and the second insulation film 32 become contact holes.

Next, a metal film such as aluminum is formed on the upper overall surface of the diode 5 by sputtering.

Figure 13:
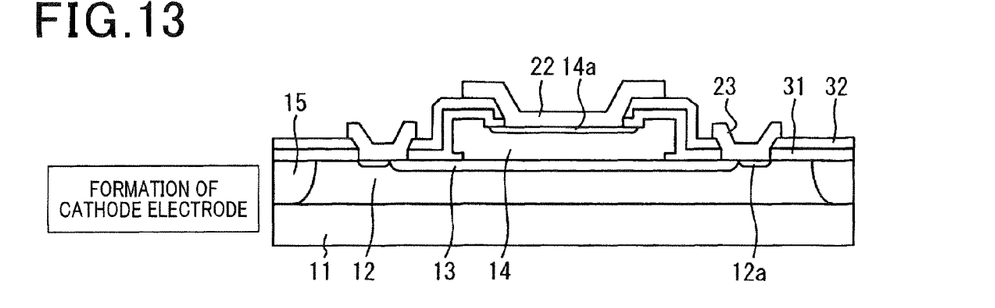
FIG. 13 is a view showing a cross section in a process of forming a cathode electrode in the manufacturing process of producing the diode according to the first exemplary embodiment of the present invention.

FIG. 13 is a view showing a cross section in a process of forming the cathode electrode 22 in the manufacturing process of producing the diode 5 according to the first exemplary embodiment;

Next, as shown in FIG. 13, a predetermined area is removed from the metal film formed by sputtering in order to form the cathode electrode 22 and the short-circuit electrode 23.

Next, insulation resin such as polyimide is applied on the upper overall surface of the diode 5 to form a protection film 40. The protection film 40 is omitted from FIG. 3 and FIG. 4.

Figure 14:
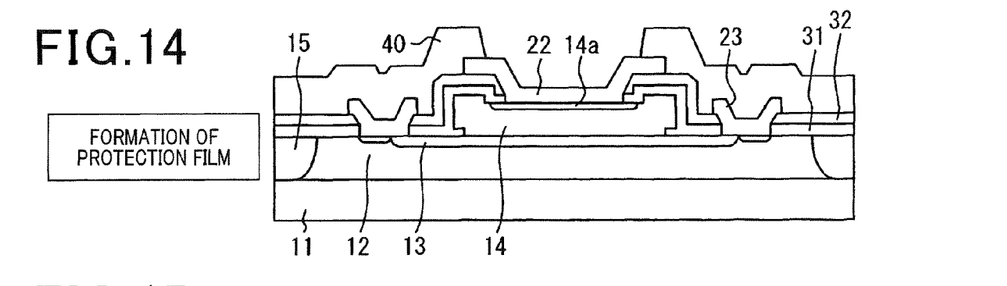
FIG. 14 is a view showing a cross section in a process of forming a protection film in the manufacturing process of producing the diode according to the first exemplary embodiment of the present invention.

FIG. 14 is a view showing a cross section in a process of forming the protection film in the manufacturing process of producing the diode 5 according to the first exemplary embodiment.

Figure 15:
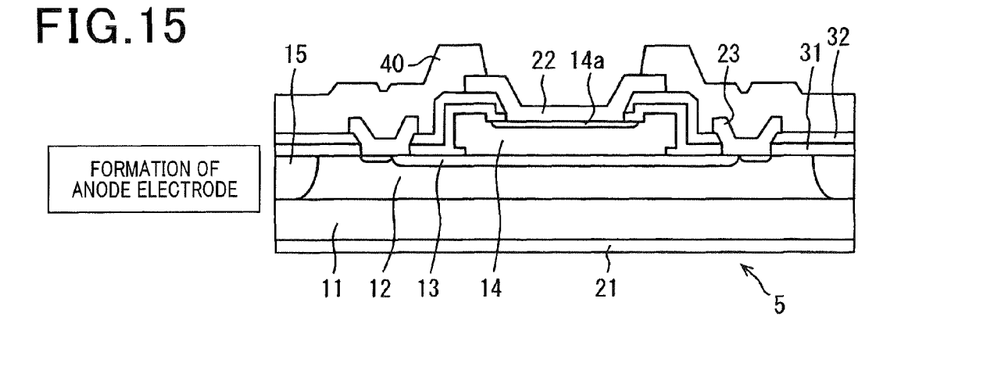
FIG. 15 is a view showing a cross section in a process of forming an anode electrode in the manufacturing process of producing the diode according to the first exemplary embodiment of the present invention.

Next, as shown in FIG. 15, the central area is removed from the cathode electrode 22 in order to expose this central area of the cathode electrode 22 to outside.

FIG. 15 is a view showing a cross section in a process of forming the anode electrode 21 in the manufacturing process of producing the diode 5 according to the first exemplary embodiment;

Next, as shown in FIG. 15, the anode electrode 21 is formed on the lower overall surface of the diode 5 by sputtering. Specifically, titanium, nickel, gold are sputtered on the lower overall surface of the diode 5 to form the anode electrode 21 having a three layer structure.

The manufacturing method previously described produces the diode 5 according to the first exemplary embodiment having the multiple p-n junction body 10 equipped with the four semiconductor layers 11 to 14, and the short-circuit layer 23 which provides the short circuit between the second semiconductor layer 12 and the third semiconductor layer 13.

As previously described, the multiple p-n junction body 10 forms the first diode element D1, the second diode element D2 and the third diode element D3. Because a short circuit is formed between the second semiconductor layer 12 and the third semiconductor layer 13 by the short-circuit electrode 23 (where the second and third semiconductor layers 12 and 13 form the third diode element D3), this structure of the diode 5 makes it possible to provide an equivalent circuit without the third diode element D3. That is, this structure of the diode 5 makes it possible to provide the equivalent circuit in which the first diode element D1 and the second diode element D2 are connected in series in the same direction. It is therefore possible for the diode 5 according to the first exemplary embodiment to have a high breakdown voltage (high withstand voltage) when compared with a diode formed by a single diode element.

Further, the diode 5 according to the first exemplary embodiment has the structure in which the short circuit of the p-n junction formed between the second semiconductor layer 12 and the third semiconductor layer 13 provides the electrical connection between the first diode element D1 and the second diode element D2 without using any solder.

Because the first diode element D1 and the second diode element D2 are electrically connected together in the diode 5 according to the first exemplary embodiment without using solder, this structure of the diode 5 makes it possible to prevent the entire size of the diode 5 from increasing in the laminating direction of the first to four semiconductor layers 11 to 14, as compared with a conventional diode having a structure shown in FIG. 17A to FIG. 17F.

It is difficult for the manufacturing process of producing the diode having the conventional structure shown in FIG. 17A to FIG. 17F to form a solder layer 91 by using lead-free solder. This makes it impossible to form the diode 5x by using any lead-free solder. That is, when the solder layer 91 is made of lead-free solder, it is possible to dissolve the solder layer 91 by acid or alkali during etching (edge treatment) of the cut surface of a lamination part 93. Further, when a lead wire 94 is connected to the lamination part 93 by soldering, the solder layer 91 is melted.

On the other hand, the diode 5 according to the first exemplary embodiment has the improved structure previously described in which the first diode element D1 and the second diode element D2 are connected in the same direction in the multiple p-n junction body 10. It is therefore possible to form the diode 5 according to the first exemplary embodiment without using the solder layer 91. By the way, the conventional diode having the structure shown in FIG. 17 requires the formation of the solder layer 91 formed by soldering. Accordingly, it is possible to easily form the diode 5 according to the first exemplary embodiment by using lead-free solder.

Because the structure of the diode 5 according to the first exemplary embodiment provides an equivalent circuit in which the diode elements D1 and D2 are connected in series, it is possible for the diode 5 to increase a thickness of each of the semiconductor layers 11 to 14 with high breakdown voltage and without decreasing an impurity concentration. Because no reduction of the surge voltage protection per unit area occurs if an impurity concentration in the diode 5 is reduced, it is possible for the diode 5 to increase the ability of the surge voltage protection without enlarging the surface area of the semiconductor layers 11 to 14.

Further, in the structure of the diode 5 according to the first exemplary embodiment, because a short circuit is made between the second semiconductor layer 12 and the third semiconductor layer 13, it is possible to provide the equivalent circuit having the structure in which the first diode element D1 and the second diode element D2 provides a p-n conjunction and are connected in series in the same direction. This structure of the diode 5 makes it possible to suppress its entire size from increasing because the diode 5 does not require any solder layer. Still further, it is possible for the diode 5 having the structure previously described to have the high breakdown voltage and surge voltage protection.

Still further, in the structure of the diode 5 according to the first exemplary embodiment, the high concentration region 12a is formed in a contact region in the second semiconductor layer 12. That is, a contact surface of the contact region as the high concentration region 12a is in contact with the short-circuit electrode 23. This high concentration region 12a has an impurity concentration which is higher than that of the remaining area of the second semiconductor layer 12. (This remaining area of the second semiconductor layer 12 is not in contact with the short-circuit electrode 23.) This structure makes it possible to reduce an electrical contact resistance between the remaining area in the second semiconductor layer 12 and the short-circuit electrode 23 when compared with a contact resistance when the short-circuit electrode 23 is directly connected to the second semiconductor layer 12 without forming the high concentration region 12a. It is therefore possible for the diode 5 according to the first exemplary embodiment to reduce the resistant to a current flowing in the diode 5 forward when the spark plug 4 is discharging.

Still further, the diode 5 according to the first exemplary embodiment has the structure in which the outer peripheral surface of the second semiconductor layer 12 is surrounded by the guard ring 15. This structure makes it possible for the guard ring 15 to prevent a leakage current which flows from the outer peripheral end surface of the second semiconductor layer 12 to the guard ring 15, not to through the third semiconductor layer 13 or the first semiconductor layer 11. In other words, the formation of the guard ring 15 in the diode 5 according to the first exemplary embodiment allows such a leakage current to flow from the outer peripheral end surface of the second semiconductor layer 12 to the third semiconductor layer 13 or the first semiconductor layer 11.

A current, which flows from the first diode element D1 to the second diode element D2, always flows in the laminating direction, i.e. from the second semiconductor layer 12 to the third semiconductor layer 13. In this case, a current flows in a normal path through the second semiconductor layer 12 between the lower overall surface of the third semiconductor layer 13 and the upper overall surface of the first semiconductor layer 11.

However, when the second separation distance L2 between the guard ring 15 and the high concentration region 12a is short, a breakdown occurs between the guard ring 15 and the high concentration region 12a. In addition, when the third separation distance L3 between the first semiconductor layer 11 and the high concentration region 12a in the laminating direction is short, a breakdown occurs between the first semiconductor layer 11 and the high concentration region 12a. When the breakdown phenomenon is generated, a current easily flows through a path having a small area, not through the normal path. In this case, only a small current can easily damage the second semiconductor layer 12, etc.

In order to solve the problem previously described, the diode 5 according to the first exemplary embodiment has the improved structure in which the second separation distance L2 is longer than the first separation distance L1 formed between the first semiconductor layer 11 and the third semiconductor layer 13. In addition to this feature, the third separation distance L3 is longer than the first separation distance L1. This improved structure of the diode 5 makes it possible to suppress the breakdown and also suppress the diode 5 having the second semiconductor layer 12 from being damaged.

Still further, the diode 5 according to the first exemplary embodiment has the improved structure in which the high concentration region 12a of the second semiconductor layer 12 is arranged adjacently to the outer peripheral part of the third semiconductor layer 13 in the horizontal direction which is perpendicular to the laminating direction (see FIG. 3), and the short-circuit electrode 23 is arranged in contact with the high concentration region 12a of the second semiconductor layer 12 and the third semiconductor layer 13 in the laminating direction (see FIG. 3).

Accordingly, it is possible to provide a short circuit member, i.e. the short circuit electrode 23 formed between the second semiconductor layer 12 and the third semiconductor layer 13 in the laminating direction from the third semiconductor layer 13 side to the second semiconductor layer 12 side. This makes it possible to easily form the short-circuit electrode 23 having a simple structure.

Still further, the short-circuit electrode 23 is formed to have a frame-shaped structure around a central axis of the diode 5 in the laminating direction. This makes it possible for the short-circuit electrode 23 to have a large area, and reduce the electrical resistance of the short-circuit electrode 23. As a result, this reduces a voltage drop in the forward direction of the diode 5.

By the way, it is also possible for the short-circuit electrode 23, i.e. the short-circuit member to have various shapes such as annular, square, rectangular, etc., for example, when viewed in the plan view shown in FIG. 4.

Second Exemplary Embodiment

A description will be given of the diode 5 according to a second exemplary embodiment with reference to FIG. 16.

As previously described the diode 5 according to the first exemplary embodiment has the improved structure in which one end terminal of the secondary coil 2 is connected to the electrode 4a of the spark plug 4, and the other terminal (i.e. the high voltage side) of the secondary coil 2 is connected to the high voltage side of the primary coil 1. Further, the high voltage side of the primary coil 1 is connected to the other terminal of the secondary coil 2 through the diode 5 according to the first exemplary embodiment. In other words, as shown in FIG. 1, the diode 5 according to the first exemplary embodiment is arranged between the high voltage side of the primary coil 1 and the high voltage side of the secondary coil 2.

Figure 16:
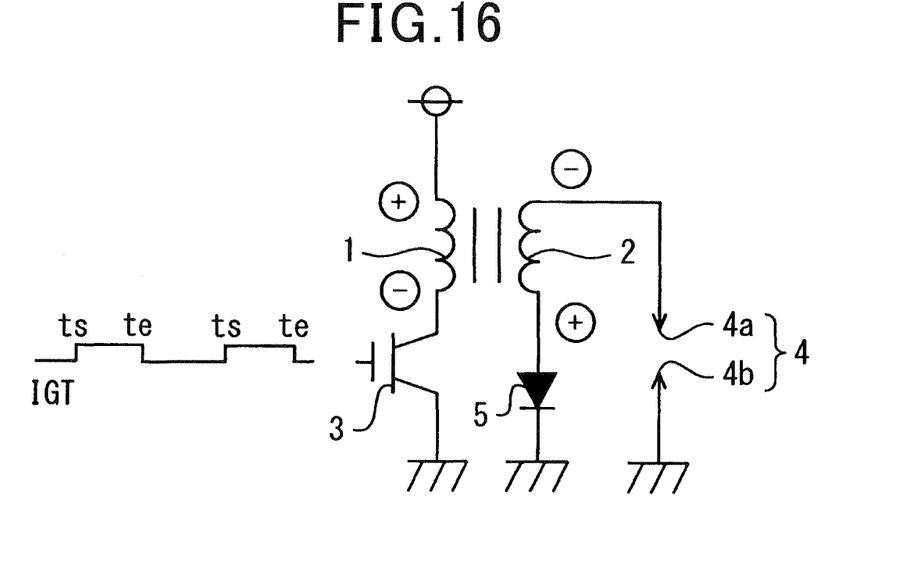
FIG. 16 is a view showing a schematic structure of an ignition device equipped with a diode according to a second exemplary embodiment of the present invention.

FIG. 16 is a view showing a schematic structure of an ignition device equipped with the diode 5 according to the second exemplary embodiment.

When compared with the ignition device equipped with the diode 5 according to the first exemplary embodiment shown in FIG. 1 previously described, the ignition device equipped with the diode 5 according to the second exemplary embodiment shown in FIG. 16 has a structure in which one end terminal of the secondary coil 2 is connected to the electrode 4a of the spark plug 4, and the other end terminal of the secondary coil 2 is earthed through the diode 5. That is, the diode 5 according to the second exemplary embodiment is connected to the ground side of the secondary coil 2. The diode 5 according to the second exemplary embodiment has the same structure of the diode 5 according to the first exemplary embodiment. Further, the diode 5 according to the first exemplary embodiment and the diode 5 according to the second exemplary embodiment can be produced by using the same manufacturing method.

Like the diode 5 according to the first exemplary embodiment shown in FIG. 1, the diode 5 according to the second exemplary embodiment shown in FIG. 16 is requested to have the high breakdown voltage (for example, not less than 2 kV) which is higher than the ON voltage. Accordingly, it is possible for the diode 5 according to the second exemplary embodiment to have the same effects and behavior of the diode 5 according to the first exemplary embodiment.

(Various Modifications)

The concept of the present invention is not limited by the first and second exemplary embodiments previously described. For example, it is possible to have the following modifications.

In the structure of the diode 5 according to the exemplary embodiments shown in FIG. 3, although the first semiconductor layer 11 of a p-type semiconductor is used as a substrate, it is acceptable to use an n-type semiconductor as the first semiconductor layer 11. In this case, it is sufficient to form the second semiconductor layer 12 by a p-type semiconductor, the third semiconductor layer 13 by an n-type semiconductor, and the fourth semiconductor layer 14 by a p-type semiconductor. That is, it is possible to form the first semiconductor layer 11 by a p-type semiconductor, and the second semiconductor layer 12 by an n-type semiconductor. It is also possible to form the first semiconductor layer 11 by an n-type semiconductor, and the second semiconductor layer 12 by a p-type semiconductor.

The diode 5 according to the exemplary embodiments shown in FIG. 3 has the structure in which the multiple p-n junction body 10 is composed of the four semiconductor layers 11 to 14, and the first diode element D1 and the second diode element D2 are connected in series. However, the concept of the present invention is not limited by this structure. For example, it is possible to form the multiple p-n junction body by using not less than six semiconductor layers, and not less than three diode elements are connected in series. This structure needs to have a plurality of short-circuit members. For example, in the multiple p-n junction body shown in FIG. 3, a fifth semiconductor layer and a sixth semiconductor layer are formed on the upper surface of the fourth semiconductor layer 14, and the fourth semiconductor layer 14 and the fifth semiconductor layer provides a short circuit through a short-circuit electrode. This structure makes it possible to provide an equivalent circuit in which the first diode element D1 and the second diode element D2, and a fourth diode element composed of the fifth semiconductor layer and the six semiconductor layer are connected in series.

It is sufficient to form the fourth semiconductor layer 14 by using a single crystal semiconductor, or a poly-crystalline semiconductor.

The diode 5 according to the exemplary embodiments shown in FIG. 3 has the structure in which the high concentration region 12*a* of the high concentration region 12*a* is formed adjacently to the third semiconductor layer 13. However, the concept of the present invention is not limited by this structure. For example, it is possible to form the high concentration region 12*a* and the third semiconductor layer 13 to be partially overlapped together. In this overlapped region between the high concentration region 12*a* and the third semiconductor layer 13, a p-type semiconductor and an n-type semiconductor are mixed. This structure makes it possible to make a short circuit of the second semiconductor layer 12 and the third semiconductor layer 13 by using a short-circuit member.

The diode 5 according to the exemplary embodiments shown in FIG. 3 has the structure in which the short-circuit electrode 23 has a frame-shaped structure previously described. However, the concept of the present invention is not limited by this structure. For example, it is possible for the short-circuit electrode 23, i.e. the short-circuit member to have another structure in which no short circuit is partially formed in the short circuit member.

The diode 5 according to the exemplary embodiments shown in FIG. 3 has the guard ring 15. However, the concept of the present invention is not limited by this structure. For example, it is possible to use, instead of using the guard ring 15, one selected from, a field plate, a field limiting ring (FLR) and a reduced surface field (RESURF). Still further, it is possible to form the semiconductor layers by using silicon carbide (SiC) instead of using silicon (Si).

The diode 5 according to the exemplary embodiments shown in FIG. 3 has the structure in which the surface (contact surface) of the short-circuit part 23*b* in the short-circuit electrode 23 which is contact with the second semiconductor layer 12 and the third semiconductor layer 13 has a flat surface extending in the horizontal direction. However, the concept of the present invention is not limited by this structure. For example, it is possible to form the contact surface of the short circuit part 23*b* in a stepped structure.

The diode 5 according to the first exemplary embodiment has the structure in which the first semiconductor layer 11 is made of a p-type semiconductor, and the second semiconductor layer 12 is formed by adding n-type impurity into a p-type semiconductor. However, the concept of the present invention is not limited by this structure. For example, it is possible to form the second semiconductor layer 12 by using an n-type semiconductor, and add p-type impurity into an n-type semiconductor to form the first semiconductor layer 11.

While specific embodiments of the present invention have been described in detail, it will be appreciated by those skilled in the art that various modifications and alternatives to those details could be developed in light of the overall teachings of the disclosure. Accordingly, the particular arrangements disclosed are meant to be illustrative only and not limited to the scope of the present invention which is to be given the full breadth of the following claims and all equivalents thereof.

What is claimed is:

1. A diode comprising:
   a first semiconductor layer of a first conductive type;
   a second semiconductor layer of a second conductive type, the first semiconductor layer and the second semiconductor layer forming a p-n junction;
   a third semiconductor layer of the first conductive type, the third semiconductor layer and the second semiconductor layer forming a p-n junction;
   a fourth semiconductor layer of the second conductive type, the fourth semiconductor layer and the third semiconductor layer forming a p-n junction; and
   a short circuit member capable of providing a short circuit between the second semiconductor layer and the third semiconductor layer; and wherein a high concentration region is formed in a contact region in the second semiconductor layer, a surface of the contact region and a portion of the third semiconductor layer are in direct contact with the short-circuit member, and the high concentration region is higher in impurity concentration than a non-contact region in the second semiconductor layer which is not in direct contact with the short-circuit member.

2. The diode according to claim 1, further comprising a guard ring which is formed around an outer peripheral surface of the second semiconductor layer, and is made of a semiconductor of a polarity which is reverse in polarity to the second semiconductor layer, wherein
   a second separation distance is longer than a first separation distance, where the first separation distance is a distance between the first semiconductor layer and the third semiconductor layer in a laminating direction along which the first semiconductor layer, the second semiconductor layer, the third semiconductor layer and the fourth semiconductor layer are stacked to provide a lamination structure, and the second separation distance is a distance between the guard ring and the high concentration region in a direction which is perpendicular to the laminating direction.

3. The diode according to claim 1, wherein a third separation distance is longer than a first separation distance, where the first separation distance is a distance between the first semiconductor layer and the third semiconductor layer in a laminating direction along which the first semiconductor layer, the second semiconductor layer, the third semiconductor layer and the fourth semiconductor layer are stacked to provide a lamination structure, and the third separation distance is a distance between the first semiconductor layer and the high concentration region in the laminating direction.

4. The diode according to claim 2, wherein a third separation distance is longer than the first separation distance, where the third separation distance is a distance between the first semiconductor layer and the high concentration region in the laminating direction.

5. The diode according to claim 1, wherein the high concentration region is formed adjacently arranged at an outer peripheral part of the third semiconductor layer in a direction which is perpendicular to the laminating direction in which the first semiconductor layer, the second semiconductor layer, the third semiconductor layer and the fourth semiconductor layer are stacked to provide a lamination structure, and
   the short-circuit member is formed in the laminating direction adjacently to the high concentration region of the second semiconductor layer and the third semiconductor layer.

6. The diode according to claim 2, wherein the high concentration region is formed adjacently arranged at an outer peripheral part of the third semiconductor layer in a direction which is perpendicular to the laminating direction in which the first semiconductor layer, the second semiconductor layer, the third semiconductor layer and the fourth semiconductor layer are stacked to provide the lamination structure, and the short-circuit member is formed in the laminating direction adjacently to the high concentration region of the second semiconductor layer and the third semiconductor layer.

7. The diode according to claim 3, wherein the high concentration region is formed adjacently arranged at an outer peripheral part of the third semiconductor layer in a direction which is perpendicular to the laminating direction in which the first semiconductor layer, the second semiconductor layer, the third semiconductor layer and the fourth semiconductor layer are formed to provide the lamination structure, and the short-circuit member is formed in the laminating direction adjacently to the high concentration region of the second semiconductor layer and the third semiconductor layer.

8. The diode according to claim 1, wherein the short-circuit member is formed to have a frame-shaped structure around the laminating direction of the first semiconductor layer, the second semiconductor layer, the third semiconductor layer and the fourth semiconductor layer.

9. The diode according to claim 1, wherein the short-circuit member is formed to have a frame-shaped structure around the laminating direction of the first semiconductor layer, the second semiconductor layer, the third semiconductor layer and the fourth semiconductor layer.

10. The diode according to claim 2, wherein the short-circuit member is formed to have a frame-shaped structure around the laminating direction of the first semiconductor layer, the second semiconductor layer, the third semiconductor layer and the fourth semiconductor layer.

* * * * *